United States Patent [19]

Swanson et al.

[11] Patent Number: 5,068,660
[45] Date of Patent: Nov. 26, 1991

[54] COMBINING FULLY-DIFFERENTIAL AND SINGLE-ENDED SIGNAL PROCESSING IN A DELTA-SIGMA MODULATOR

[75] Inventors: Eric J. Swanson, Buda; Bruce P. Del Signore, Austin, both of Tex.

[73] Assignee: Crystal Semiconductor Corporation, Austin, Tex.

[21] Appl. No.: 428,397

[22] Filed: Oct. 27, 1989

[51] Int. Cl.$^5$ ............................................... H03M 3/02
[52] U.S. Cl. .................................... 341/143; 341/172; 375/28
[58] Field of Search ................. 341/143, 155, 166, 172, 341/150; 375/25-29; 330/9, 51, 109

[56] References Cited

U.S. PATENT DOCUMENTS 4,857,928 8/1989 Gailus et al. ..................... 341/143
4,866,442 9/1989 Steim et al. ...................... 341/143

OTHER PUBLICATIONS

Kuo-Chiang Hsieh et al., "A Low-Noise Chopper-Stabilized Differential Switched-Capacitor Filtering Technique," IEEE Journal of Solid-State Circuits, vol. SC-16, No. 6, Dec. 1981.

Norsworthy, Steven R. et al., "A 14-Bit 80-kHz Sigma-Delta A/D Converter: Modeling, Design and Performance Evaluation," IEEE J. of Solid-State Circuits, vol. 24, No. 2, Apr. 1989.

Primary Examiner—A. D. Pellinen
Assistant Examiner—Brian K. Young
Attorney, Agent, or Firm—Leonard & Lott

[57] ABSTRACT

An oversampling analog-to-digital modulator includes an analog loop filter which has a first integrator stage which is a single-ended integrator. The second, third, and fourth integrator stages are fully-differential integrators. The first integrator provides the required thermal noise characteristics of the loop filter with only one feedback capacitor which is external to the integrated circuit chip, while the fully-differential integrator stages provide improved suppression of charge injection transients.

9 Claims, 3 Drawing Sheets

COMBINING FULLY-DIFFERENTIAL AND SINGLE-ENDED SIGNAL PROCESSING IN A DELTA-SIGMA MODULATOR

CROSS REFERENCE TO RELATED APPLICATIONS

Reference is made to a first related application entitled COMBINING CONTINUOUS TIME AND DISCRETE TIME SIGNAL PROCESSING IN A DELTA-SIGMA MODULATOR, Ser. No. 07/428,396, filed Oct. 27, 1989, in the names of Sooch, Navdeep S., Kerth, Donald A., Del Signore, Bruce P., and Swanson, Eric J.; and to a second related application entitled NOISE REDUCTION IN DELTA-SIGMA MODULATORS BY CHOPPER STABILIZATION AT THE SAMPLING FREQUENCY, Ser. No. 07/429,211, filed Oct. 27, 1989, in the names of Welland, David R., Del Signore, Bruce P., and Kerth, Donald A. These applications, respectively, disclose and claim a delta-sigma modulator which uses a combination of continuous time and discrete time integrators in the loop filter, and which uses a chopper stabilized continuous time operational amplifier in the loop filter in which the chopper frequency is the same as the sampling frequency of the delta-sigma modulator. These two improvements are used in the preferred embodiment of the present invention.

TECHNICAL FIELD

The present invention pertains to analog-to-digital converters in general, and more particularly, to modulators used in oversampling analog-to-digital converters.

BACKGROUND OF THE INVENTION

Oversampling analog-to-digital converters generally consist of a modulator section which receives an analog signal and provides a serial data stream having a bit rate which is much greater than the Nyquist sampling frequency, followed by a digital filtering and decimation section which provides at its output a digitized representation of the analog input signal. Inside the modulator is an analog loop filter which is coupled to a summing node at its input and which provides an output that is digitized by a one bit analog-to-digital converter. The output of the one bit analog-to-digital converter forms the output of the modulator. The summing node sums the analog input signal with the output of the one bit analog-to-digital converter to provide an error signal which is input to the analog loop filter.

In the past, the analog loop filter has usually been comprised of either all single-ended integrators or all fully-differential integrators. Both the single-ended integrator and the fully-differential integrator have their advantages and disadvantages. For example, the single-ended integrator, while lacking the power supply rejection ratio (PSRR), linearity, and output swing of a fully-differential integrator, does enable an integration with only one feedback capacitor and input resistor as compared with the two capacitors and input resistors required of a fully-differential integrator. The fully-differential integrator, while requiring two sets of feedback capacitors which must be matched, does provide the increased PSRR, increased linearity (by minimizing the even order non-linearity in a discrete time integrator), and an increase in the differential output swing as compared to a single-ended output integrator.

Therefore it can be appreciated that an analog loop filter in an oversampling analog-to-digital modulator which is able to combine the favorable characteristics of a single-ended integrator and a fully-differential integrator while avoiding the major disadvantages of each type of integrator is highly desireable.

SUMMARY OF THE INVENTION

It is, therefore, an object of this invention to provide an oversampling analog-to-digital modulator which includes a loop filter which combines the advantageous characteristics of a single-ended integrator and a fully-differential integrator while avoiding the major disadvantages of each type of integrator.

Shown in an illustrated embodiment of the invention is a plurality of integrators in an analog-to-digital modulator in which at least one of said integrators is a single-ended integrator and at least another of which is a fully-differential integrator.

Also shown in an illustrated embodiment of the invention is an analog-to-digital modulator comprising a summing circuit coupled to an analog loop filter which in turn is coupled to a quantizer. The output of the quantizer is coupled to the input of a digital-to-analog (D/A) converter. The output of the D/A converter forms one input to the summing circuit, the other input being an analog input voltage. The analog loop filter comprises a plurality of integrators, at least one of which is a single-ended integrator and at least another of which is a fully-differential integrator.

In a further aspect of the invention, the single-ended integrator is the first stage of the analog loop filter followed by three stages of fully-differential integrators.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
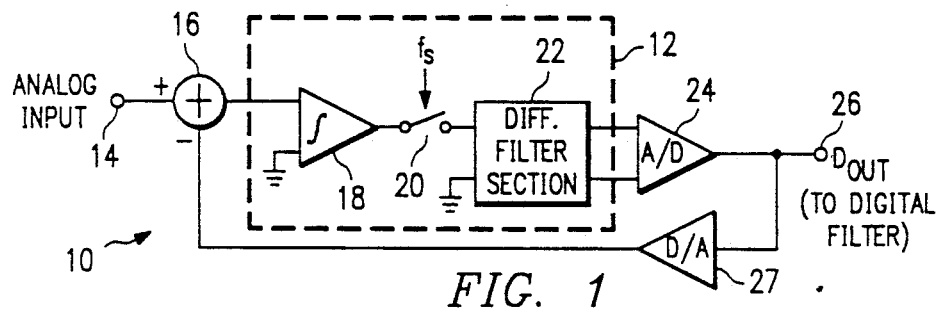
FIG. 1 is a block diagram of a delta-sigma modulator containing an analog loop according to the present invention.

It will be appreciated that for purposes of clarity and where deemed appropriate, reference numerals have been repeated in the figures to indicated corresponding features.

DETAILED DESCRIPTION OF A PREFERRED EMBODIMENT

A loop filter in an oversampling analog-to-digital modulator according to a preferred embodiment of the present invention is a fourth order filter having a first integrator stage comprised of a single-ended integrator followed by fully-differential second, third, and fourth integrator stages. The first integrator, the single-ended integrator, is a chopper-stabilized, continuous time integrator with a single feedback capacitor which is external to the integrated circuit which embodies the delta-sigma modulator containing the analog loop filter. The single-ended, continuous time first stage integrator is able to achieve an 130 dB S/N ratio while the second, third, and fourth fully-differential, discrete time integrators, using precisely proportioned switching capacitors, are able to achieve the precise positioning of the poles and zeroes of the transfer function to provide robust stability of the fourth order loop filter.

As used herein, the term fully-differential integrator means an integrator which has both a differential input and a differential output. The term differential meaning that the signal is the difference between the voltage or current on two time-varying nodes. The term single-ended integrator means an integrator which has a non-differential input and/or a non-differential output.

Advantageously, a combination of a first stage single-ended integrator with second, third, and fourth stages of fully-differential integrators combines the PSRR, linearity, an output voltage swing of the fully-differential integrator with the requirement of only a single feedback capacitor and input resistor of the fully continuous first stage which, in the preferred embodiment, is external to the integrated circuit, thus obviating the necessity to provide matched capacitors and resistors. In the preferred embodiment the relatively small output voltage swing of the first stage and the predominance of the thermal noise in the first stage would not allow a fully-differential first stage to take advantage of the output voltage swing inherent in a differential amplifier, whereas the PSRR of a fully-differential integrator decreases the power supply noise sensitivity in the second, third, and fourth integrators. Moreover, in the preferred embodiment the discrete time second, third, and fourth integrator stages produce clock charge injection into these stages, but the fully-differential nature of these stages greatly reduces the effects of this injection as compared to single-ended integrator stages. The advantages of the continuous time first stage and the discrete times second, third, and fourth stages are described in detail in the above-referenced patent application entitled COMBINING CONTINUOUS TIME AND DISCRETE TIME SIGNAL PROCESSING IN A DELTA-SIGMA MODULATOR, which is hereby incorporated by reference. The chopper stabilization in the single-ended, continuous time integrator is described in detail in the above referenced patent application entitled NOISE REDUCTION IN DELTA-SIGMA MODULATORS BY CHOPPER STABILIZATION AT THE SAMPLING FREQUENCY, which is hereby incorporated by reference.

Turning now to the drawings, FIG. 1 shows a block diagram of an analog-to-digital delta-sigma modulator 10 containing an analog loop filter 12 according to the present invention. An analog input signal on an input terminal 14 is connected to the positive input of a summing circuit or summer 16. The output of the summer is connected to the input of the loop filter 12 which is also the input to the first filter section 18 of the analog loop filter 12. The first filter section 18 is a single-ended integrator section. The output of the single-ended filter section 18 is converted to a discrete time signal by a switch 20 which is driven by signal $f_s$. Connected to the other side of the switch 20 is a fully-differential filter section 22. The output of the fully-differential filter section 22 forms the output of the analog loop filter 12 and is connected to the input of a quantizer or A/D converter 24 which, in the preferred embodiment, is a one bit analog-to-digital converter. The output of the A/D converter 24 forms the output Dout at output terminal 26 and also forms the input to a digital-to-analog (D/A) converter 27. The output of the D/A converter 27 is connected to the negative input of the summer 16. The Dout signal at terminal 26 is input to a digital filter network which attenuates the high frequency noise at the output of the modulator 10 and which also decimates the oversampled serial bit stream at the output 26 to usually form a conventional n parallel bit representation of the analog input signal applied to the input terminal 14.

In operation, the analog input signal at input terminal 14 is summed with the output of the D/A converter 27 and the error signal is input to the analog loop filter 12. The analog loop filter 12 amplifies and filters the error signal in the single-ended filter section 18 and further amplifies and processes the error signal in the fully-differential filter section 22. The output of the fully-differential filter section 22 is then converted to a one bit digital signal in the A/D converter 24, which in turn, is converted to an analog signal in the D/A converter 27. In the analog-to-digital modulator 10 of the preferred embodiment, which provides a S/N ratio of 120 dB at a bandwidth of 500 Hz, a fully discrete analog loop filter would require input capacitors to the first stage of several hundred picofarads in order to sufficiently suppress the sampled thermal noise (proportional to kT/C). Capacitors of this size are difficult to integrate and would present a large load to the operational amplifiers, which would cause distortion in the output of the modulator 10 due to non-linear settling of the analog input and non-linear sampling due to the opening and closing of the sampling switches. The single-ended, continuous time filter section 18, while requiring an external feedback capacitor and an external input resistor, is able to provide the thermal noise characteristics required of the input stage of the analog loop filter 12 without the switching problems created by a fully discrete time analog loop filter 12.

Figure 2:
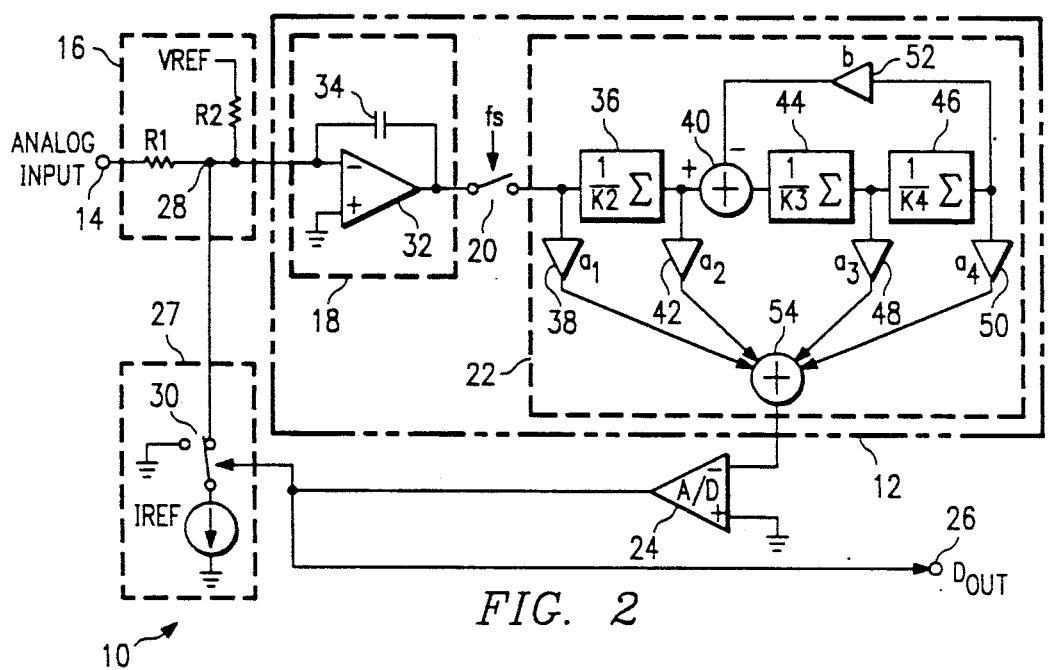
FIG. 2 is a more detailed block diagram of the delta-sigma modulator of FIG. 1 which is useful for analyzing the analog loop transfer function.
Figure 3B:
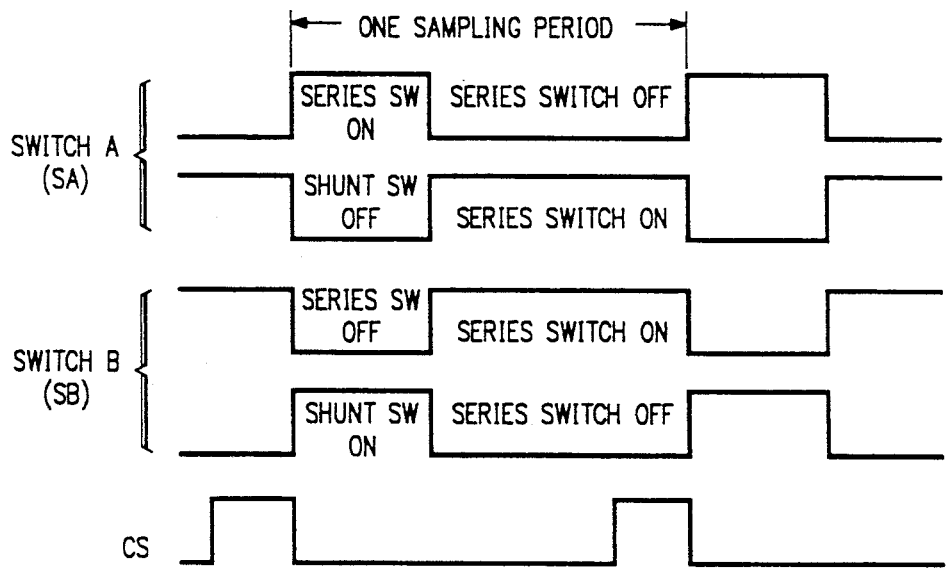
FIG. 3B is a timing diagram of the switching elements shown in FIG. 3A.
Figure 3A:
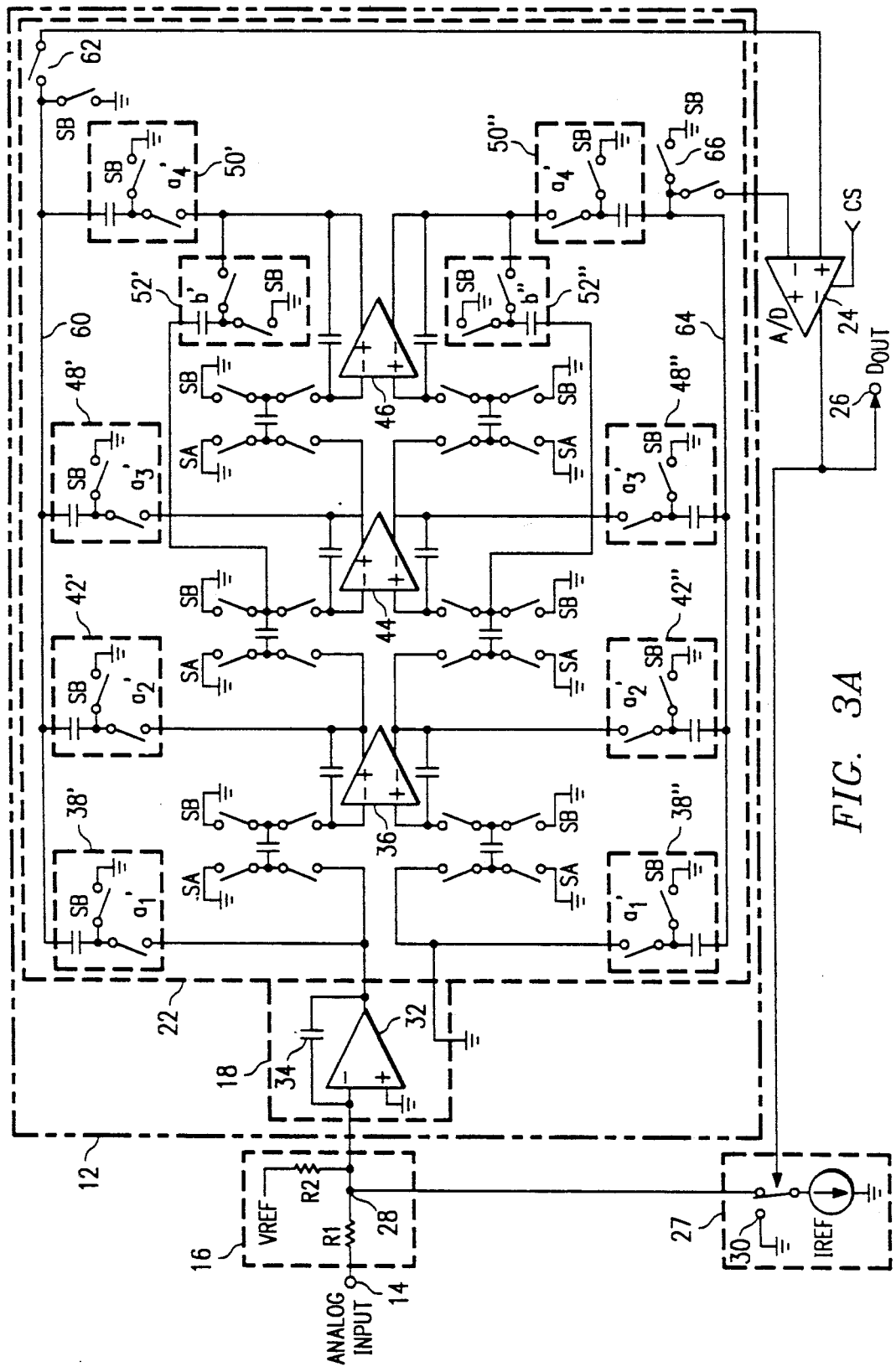
FIG. 3A is a more detailed block diagram of the delta-sigma modulator of FIG. 2 showing the switching elements in the fully-differential integrator portion of the analog loop.

FIG. 2 is a more detailed block diagram of the analog-to-digital modulator 10 of FIG. 1 which is useful for analyzing the analog loop transfer function. However, it will be understood that although the filter section 22 is shown as single-ended for purposes of understanding the transfer function of the fourth order filter of the preferred embodiment, the filter section 22 is fully differential as shown in FIG. 3A. The summer 16 is shown in FIG. 2 as a summing node 28 having a first resistor, R1, coupled between the input terminal 14 and the summing node 28, and a second resistor, R2, coupled between a reference voltage VREF and the summing node 28. The D/A converter 27 is shown as the series combination of a switch 30 and a reference current, IREF, coupled between the summing node 28 and ground. The summing node 28 is connected to the input of the analog loop filter 12 at the input of the single-ended filter section 18 which consists of a chopper stabilized operational amplifier 32 having a feedback capacitor 34. The current source IREF is also chopper stabilized in the preferred embodiment as described in the above referenced application entitled NOISE REDUCTION IN DELTA-SIGMA MODULATORS BY CHOPPER STABILIZATION AT THE SAM- PLING FREQUENCY. It will be understood by those skilled in the art that the resistors R1 and R2, while shown as part of the summer 16, are also part of the single-ended filter section 18 in that the transfer characteristics of the single-ended filter section 18 are determined in part by resistors R1 and R2. The output of the op amp 32 is connected through the sampling switch 20 to the input of the fully-differential filter section 22. The input of the fully-differential filter section 22 is connected to the input of a first integrator 36 and also to the input of a first feedforward element 38 shown as a in FIG. 2. The output of the integrator 36 is connected to the positive input of a summer 40 and to the input of a second feedforward element 42 shown as $a_2$. The output of the summer 40 is connected to the input of a second integrator 44, the output of which is connected to the input of a third integrator 46 and to the input of a third feedforward element 48 shown as $a_3$. The output of the third integrator 46 is connected to the input of a fourth feedforward element 50, shown as $a_4$, and to the input of a feedback element 52 shown as b. The output of the feedback element 52 is connected to the negative input of the summer 40. The outputs of each of the feedforward elements 38, 42, 48, and 50 are summed together in a third summer 54 the output of which is connected to the input of the A/D converter 24. The output of the A/D converter 24 provides Dout and is used to control the switch 30 in the D/A converter 27.

As can be seen from FIG. 2, the analog loop filter 12 is a fourth order loop filter that is conditionally stable. The stability of a fourth order modulator is dependent upon the ratio of the sampling period to the second, third, and fourth integrators time constants. For continuous time integrators the RC time constants are very uncontrolled compared to the accurate control of the capacitor ratios which determine the time constant for the discrete time integrators. In the preferred embodiment, the stability of the fourth order modulator 10 is not determined by the time constant of the first integrator consisting of the op amp 32, capacitor 34 and the resistors R1 and R2 but rather by the pole and zero locations of the second integrator (36), third integrator (44), and the fourth integrator (46), and these pole and zero locations are determined by the ratios of the capacitors shown in FIG. 3A.

As described above, the thermal noise characteristics of the single-ended, continuous time filter section 18 is sufficient for the requirements of the present application, and since the thermal noise requirements of the second integrator is equal to the thermal noise requirements of the first integrator divided by the gain of the first integrator, the second integrator using fully-differential integration can provide the required thermal noise characteristics with capacitors of less than 10 picofarads which are capacitor values which operate well with operational amplifiers used in the discrete time filter section 22.

FIG. 3A is a block diagram of the analog-to-digital modulator 10 in which the fully-differential filter section 22 is shown in more detail than in FIG. 2. As shown in FIG. 3A, the integrator stages of the filter section 22 are fully differential with differential input capacitors and differential feedback capacitors around each of the individual op amps and in which the feedforward elements $a_1$–$a_4$ are capacitor pairs shown as $a_1'$, $a_1''$–$a_4'$, $a_4''$, respectively, and the feedback element b consists of a pair of feedback capacitors b' and b''. Thus the feedforward elements 38, 42, 48, and 50 are shown as pairs of switches and capacitors 38', 38''; 42', 42''; 48', 48''; and 50', 50''. Similarly, the feedback element 52 is shown as a combination switch and capacitor 52', and switch and capacitor 52''. A common node connects the upper feedforward elements 38', 42', 48' and 50' and is coupled through a switch 62 to the positive input of the A/D converter 24. Similarly, a common node 64 is a common connection for the lower halves of the feedforward elements 38'', 42'', 48'', and 50'' and is coupled through a switching pair 66 to the negative input of the A/D converter 24. Thus the summer 54 shown in FIG. 2 is two separate summing nodes 60 and 64 and their corresponding switch pairs 62 and 66.

The switch pairs shown in FIG. 3A are labeled either SA or SB. As shown in FIG. 3B, the SA switches have their series switches closed and their shunt switches open during the first quarter period of each sampling period (which in the preferred embodiment is 4 microseconds), and their shunt switch closed and their series switch open during the last three quarters of each sampling period. Conversely, the switches labeled SB have their series switch open and their shunt switch closed during the first quarter of each sampling period, and their series switch closed and their shunt switch open during the last three quarters of each sampling period. Also shown in FIG. 3A is another input to the A/D converter 24 labeled CS. This input is a converter sample signal which, as shown in FIG. 3B, is high during the last portion of each sampling period to allow the A/D converter 24 to sample the inputs during the time the CS signal is transitioning high and to hold the output of the A/D converter 24 constant during the time when the CS signal is steady or transitioning low.

Advantageously, the analog-to-digital modulator 10 of the present invention uses a single ended continuous time integrator 18 followed by fully differential discrete time filter section 22. While a differential integrator has advantages such as power supply rejection and diminished second harmonic distortion, and is advantageously used in the discrete time filter section 22, a fully differential continuous time filter section 18 would require an additional external capacitor and resistor, and these external capacitors and resistors would have to be matched to about 0.1% to accurately control gain and offset. Closely matched resistors and capacitors generally are not readily available and are expensive.

Figure 4A:
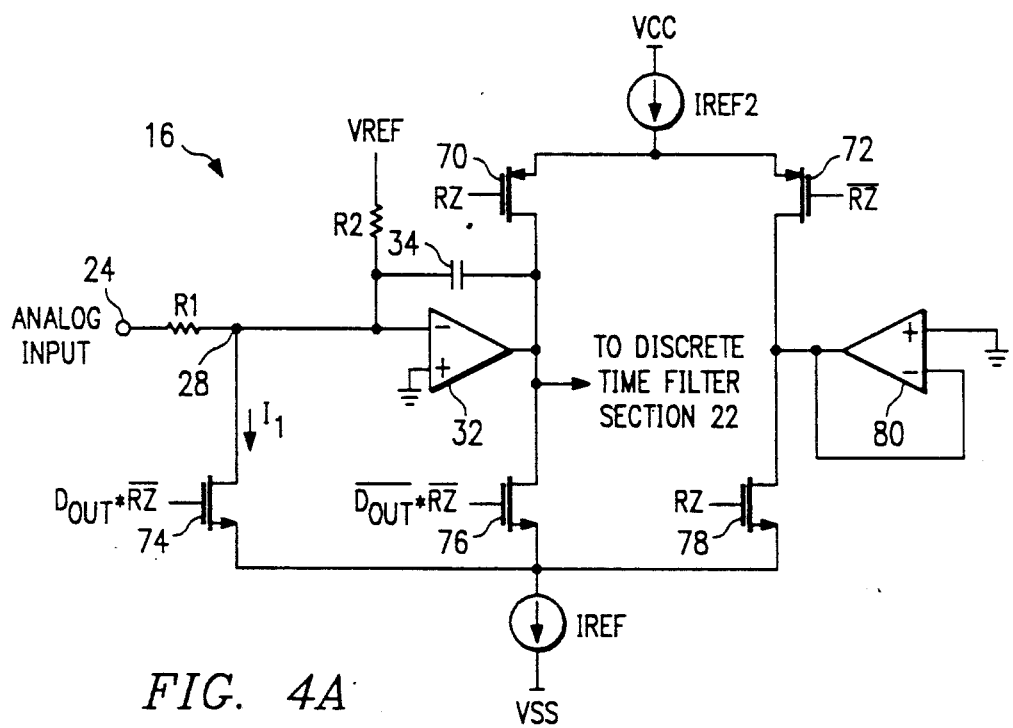
FIG. 4A is a schematic diagram of the input summing circuit of the delta-sigma modulator shown in FIG. 1.
Figure 4B:
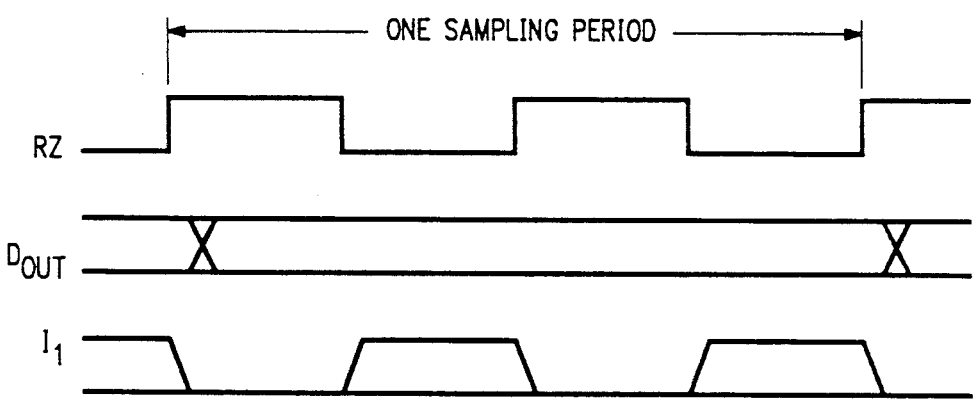
FIG. 4B is a timing diagram of the switching signals shown in FIG. 4A.

The summing circuit 16 and the D/A converter 27 are shown in detail in FIG. 4A. As shown in FIG. 4A, the summing circuit 16 and D/A converter 27 include not only resistors R1, R2, and the current source IREF, but also a second current source IREF2 (connected to VCC), two p channel transistors 70 (connected between IREF2 and the output of the op amp 32) and 72 (connected between IREF2 and the output of an op amp 80), and three n channel transistors 74 (connected between the summing node 28 and IREF), 76 (connected between the output of the op amp 32 and IREF), and 78 (connected between the output of the op amp 80 and IREF). The op amp 80 is configured to provide a ground potential at its output. With reference now to FIG. 4B, the summing circuit 16 and D/A converter 27 start with a return to zero operation in which the RZ signal is high ($\overline{RZ}$ is low) so that the p channel transistor 72 is enabled thereby coupling the current out of IREF2 to the output ground of op amp 80, and also n channel transistor 78 is conductive thereby providing a ground input to the current source IREF. The RZ signal is high during the first and third microseconds of the four microsecond sampling period and during this time the summinq node 2B is being charged by the current through R1 and R2. During the second and fourth microseconds of the sampling period the signal RZ is low which enables the p channel transistor 70 and also enables either one of the n channel transistors 74 or 76 depending on the logic level of the signal Dout produced at the output of the A/D converter 24. When Dout is a logic high level, then the n channel transistor 74 is enabled, which sinks current, shown as Il, out of the summing node 26. When the Dout signal is a logic low level, then the n channel transistor 74 is non-conductive and current is not sunk out of the summing node 26. When Dout is a logic low level, the n channel transistor 76 is enabled which provides a current path from the output of the op amp 32 to the current source IREF. The n channel transistor 76 is enabled when Dout has a logic low in order to provide equal glitches to the summing node 26 when the data out of the a/d converter 24 is either a high logic level or a low logic level since the feedback capacitor 34 provides a virtual short circuit for these switching glitches. The RZ times are used to ensure that the current out of the summing node 26 when Dout is at a high logic level is independent of the previous state of Dout.

In the preferred embodiment, both R1 and R2 are external components which allows a converter's full scale range to be tailored to maximize the overall system noise performance thus providing additional end user versatility to the analog-to-digital modulator 16.

Although the invention has been described in part by making detailed reference to a certain specific embodiment, such detail is intended to be, and will be understood to be, instructional rather than restrictive. It will be appreciated by those skilled in the art that many variations may be made on the structure and mode of operation without departing from the spirit and scope of the invention as disclosed in the teachings contained herein. For example a single-ended integrator can either be continuous or discrete time, and a fully-differential integrator can also either be continuous or discrete time.

What is claimed is:

1. A plurality of serially coupled integrators in an analog-to-digital modulator characterized in that at least one of said integrators is a single-ended integrator and at least another of said integrators is a fully-differential integrator.

2. An analog-to-digital modulator including a summing circuit coupled to an analog loop filter, the output of which is coupled to a quantizer, the output of which is coupled to a D/A converter, the output of which is coupled to one input of said summing circuit, a second input of said summing circuit being adapted to receive an analog input signal, wherein the analog loop filter comprises a plurality of serially coupled integrators, at least one of said integrators is a single-ended integrator and at least another of said integrators is a fully-differential integrator.

3. The analog-to-digital modulator set forth in claim 2 wherein the first integrator of said analog loop filter comprises a single-ended integrator and the remaining integrators of said analog loop filter consist of fully-differential integrators.

4. The analog-to-digital modulator set forth in claim 3 wherein said analog loop filter is a fourth order filter.

5. An analog loop filter comprising a plurality of serially coupled integrator stages in which at least one of said integrator stages includes a single-ended integrator and at least another of said integrator stages includes a fully-differential integrator.

6. The analog loop filter set forth in claim 5 wherein said first integrator comprises a single-ended integrator and the rest of the integrators of said analog loop filters comprise fully-differential integrators.

7. An analog-to-digital modulator comprising:
 a) an input terminal for receiving an analog input voltage;
 b) an input resistor coupled to said input terminal and to a summing node;
 c) a current resistor coupled between said summing node and a voltage reference to form a current source path to said summing node;
 d) a single-ended integrator having its input coupled to said summing node;
 e) a plurality of fully-differential integrator stages connected in series, said plurality having an input coupled to the output of said single-ended integrator and including at least one feedback group within said plurality of discrete time integrators;
 e) a plurality of feedforward elements each coupled to different nodes within said plurality of discrete time integrator stages; and
 f) a one bit analog-to-digital converter for receiving the outputs of said plurality of feedforward elements and for providing a digital output of the analog-to-digital modulator, said analog-to-digital converter output also being used to switch a current sink path coupled to said summing node, said current switch being responsive to the digital state of the output of said analog-to-digital modulator.

8. The analog-to-digital modulator set forth in claim 7 wherein said plurality of fully-differential integrators includes switched capacitors and wherein said feedback elements and said feedforward elements comprise switched capacitors.

9. A plurality of serially coupled integrators in an analog-to-digital modulator as set forth in claim 1 wherein said analog-to-digital modulator further includes a summing circuit and an A/D converter, the output of said summing circuit being coupled to the input of said plurality of said serially coupled integrators, and the output of said serially coupled integrators being coupled to the input of said A/D converter.

* * * * *